United States Patent [19]

Freeman

[11] 4,366,229

[45] Dec. 28, 1982

[54] METHOD OF MAKING COLD SHIELD FOR INFRARED DETECTOR ARRAY

[75] Inventor: Wallace L. Freeman, Woodbridge, Va.

[73] Assignee: The United States of America as represented by the Secretary of the Army, Washington, D.C.

[21] Appl. No.: 318,766

[22] Filed: Nov. 6, 1981

[51] Int. Cl.³ .............................................. C23F 1/02
[52] U.S. Cl. ..................................... 430/312; 29/572; 156/644; 156/652; 156/661.1; 427/74; 430/313; 430/318
[58] Field of Search ................. 29/572; 156/650–652, 156/656, 659.1, 661.1, 644; 136/89 PC, 89 CC; 357/29, 30; 427/74, 75, 76; 430/312, 313, 316, 318, 319, 329, 317

[56] References Cited

U.S. PATENT DOCUMENTS

| | | | |
|---|---|---|---|
| 3,962,778 | 6/1976 | Palmer | 427/75 X |
| 3,978,580 | 9/1976 | Leupp et al. | 156/652 X |
| 4,184,909 | 1/1980 | Chang et al. | 156/659.1 X |
| 4,313,022 | 1/1982 | Jordan et al. | 29/572 X |

Primary Examiner—William A. Powell
Attorney, Agent, or Firm—Nathan Edelberg; Milton W. Lee; Aubrey J. Dunn

[57] ABSTRACT

An infrared detector array and its associated read-out conductors on a substrate are covered with an electrically insulating photoresist layer. This layer is metalized, and a thin photoresist layer is applied atop the metal. The thin photoresist layer is exposed through a mask having perforations corresponding to the detectors of the array and to desired bonding lead regions on the conductors; when the layer is developed, regions of the metal are thus uncovered. These uncovered regions are then etched away and the insulating photoresist layer is exposed and developed, with the remaining metal acting as a mask. The thin photoresist layer may be stripped any time after the metal is etched. An array is produced in which regions above and closely around the detectors are uncovered, and regions on the read-out conductors are uncovered. Bonding leads may be applied to the read-out conductors in their exposed regions.

2 Claims, 2 Drawing Figures

METHOD OF MAKING COLD SHIELD FOR INFRARED DETECTOR ARRAY

The invention described herein may be manufactured, used, and licensed by the U.S. Government for governmental purposes without the payment of any royalties thereon.

BACKGROUND OF THE INVENTION

This invention is in the field of cold shields for infrared detector arrays. Such arrays consist of infrared detectors grown or otherwise formed or applied to an insulating or semiconductor substrate, and have the various bias and/or read-out electrical conductors on the substrate and connected to the detectors. The arrays may be either one or two dimensional, i.e. they may consist of a single line of detectors, or multiple parallel lines. In either event, the array is cryogenically cooled and infrared radiation from some desired field-of-view is directed thereon. In order to reduce the effects of radiations from sources outside the field of view and to help establish and maintain a substantially uniform detector temperature, a cold shield may be used. The cold shields currently used are perforated plates of insulation or of metal-coated insulation which are glued by hand onto the substrate holding the detector array. Since the detector arrays now commonly used are small, it is necessary to perform the gluing operation under a microscope. The operation has several disadvantages, including the difficulty of applying a uniform glue line—a typical glue line may be less than a micrometer thick and several micrometers in length and width. Moreover, it requires skilled workers to apply the shields, and only one can be applied at a time. Also, the shields require a separate processing line for their fabrication from the line used to make the arrays. All of these disadvantages combine to yield a cold shield which is very expensive to produce, compared to the cold shield as invented by the instant inventor. Specifically, the instant invention includes steps compatible with the normal steps of making the array, requires no skilled hand labor, does not require separate facilities to produce the cold shield, and is thus much cheaper and easier than the prior art methods.

SUMMARY OF THE INVENTION

The invention is a method of making a cold shield for an infrared detector array. The method includes the steps of covering the array and its associated substrate and electrical conductors with an insulating photoresist. The photoresist in turn is metalized; the metal thus applied is coated with a thin layer of photoresist. This thin layer of photoresist is exposed and developed to make holes therethrough uncovering the metal and correpsonding to the detectors. An etchant is used to remove the uncovered metal and to thus uncover the insulating photoresist over the detectors. Finally, the insulating photoresist is exposed (through the holes in the metal) and developed to uncover the detectors. The thin layer of photoresist on the metal may be removed when desired, as, for example, immediately after the uncovered metal is removed.

DESCRIPTION OF PREFERRED EMBODIMENT

Figure 1:
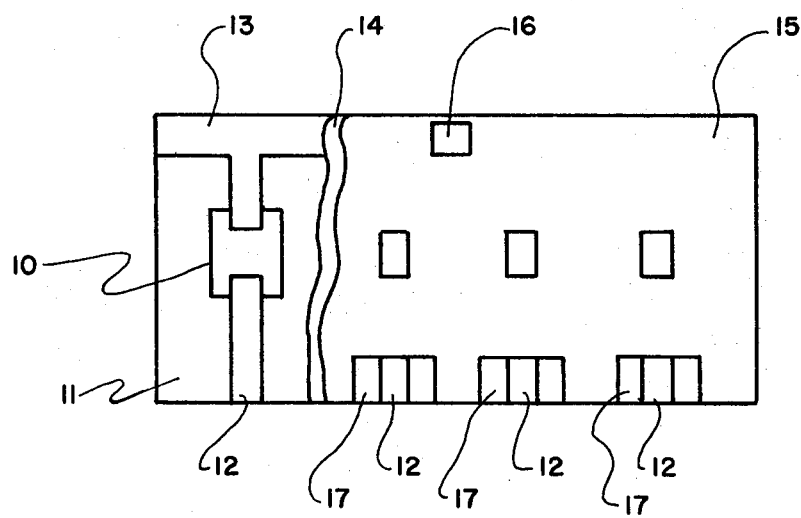
FIG. 1 is a top view, partially cut away, of a detector array made in accordance with the invention.

The invention may be best understood when this description is taken in conjunction with the drawings, in which FIG. 1 shows a detector array on which a cold shield has been applied in accordance with the instant invention. The detector array consists of detector 10 on substrate 11. Each detector is connected to its respective lead 12 and to common lead 13. Insulating photoresist layer 14 and metal layer 15 cover the substrate around and between detectors 10 and form the cold shield. Although a linear array of detectors is shown, it should be understood that the invention is also applicable to two-dimensional arrays of detectors. In any event, regions will be uncovered on the read-out conductors, such as at 16 and 17, whereby the usual bonding leads may be connected to the read-out conductors.

Typical examples of the thicknesses of the various layers of the cold shield as made by the invention are as follows: insulating photoresist layer: 5 mils; metal layer: 3000 Å; thin layer of photoresist: 2 μm.

Figure 2:
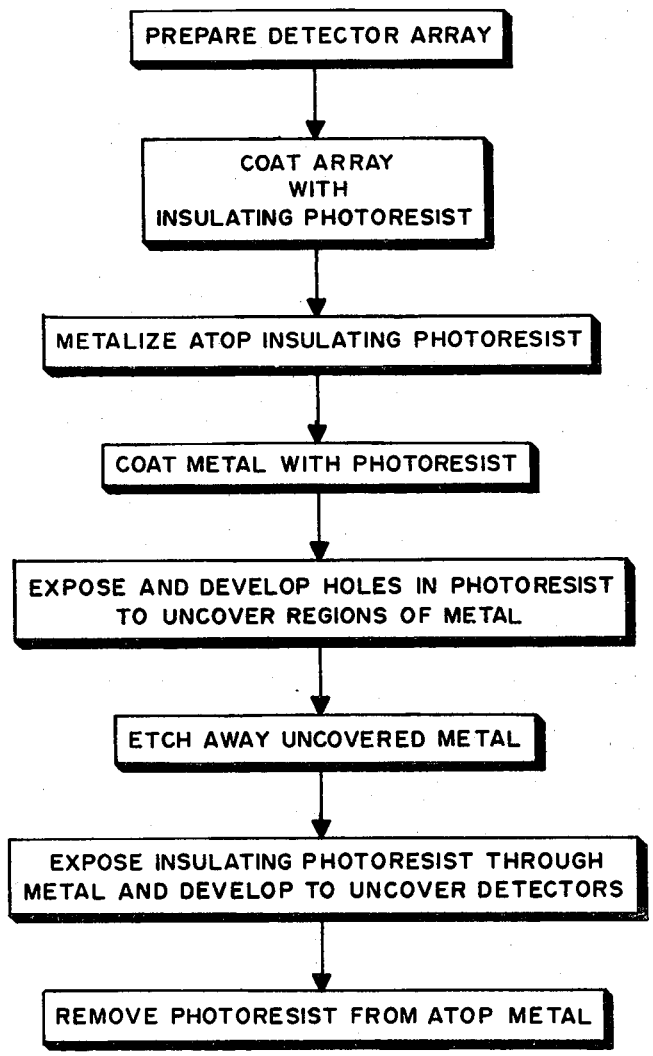
FIG. 2 is a flow chart of the inventive method.

The method by which the cold shield is formed is shown in the flow chart of FIG. 2 and starts with a detector array prepared in the usual manner. This manner includes the steps of making a substrate, forming individual detectors on the substrate, and making conductive leads connecting to the detector. The substrate may be as insulator or a semiconductor, depending on the type of detector. The inventive method is usable with photoconductive, photovoltaic, pyroelectric, or other types of detectors, and has as its first step the coating of the array with an electrically insulating photoresist. Atop this photoresist a thin metal layer is deposited, as by evaporation or spattering. The metal layer in turn is coated with a thin layer of photoresist. This last photoresist is exposed through a mask having perforations corresponding to the detectors of the array and to portions of leads 12 and 13, and is developed to uncover corresponding regions of the metal layer. An etchant is then used to remove those uncovered metal regions and to thus uncover regions of the insulating photoresist. Using the remaining metal as a mask, the uncovered regions of the insulating photoresist are exposed and developed to uncover the detectors. Finally, the thin photoresist layer is removed from atop the metal layer. Electrical bonding leads (not shown on the drawings) may be connected to leads 12 and 13 in the usual manner, but their connection is not part of the instant invention. Although the above steps have been recited in a certain order, it is possible to change the sequence somewhat without departing from the scope of the invention. For example, the thin photoresist layer atop the metal layer may be removed as soon as the metal is etched.

I claim:

1. A method of applying a cold shield to an array of photodetectors and their associated read-out conductors on one side of a substrate, including the steps of:
   (a) coating said photodetector, said read-out conductors, and said one side substrate with an electrically insulating photoresist;
   (b) metalizing said photoresist;
   (c) applying atop the metal a thin layer of photoresist;
   (d) exposing said thin layer of photoresist through a mask having perforations corresponding to regions including and closely surrounding said photodetectors and to regions on said read-out conductors;

(e) developing said thin layer to produce perforations therethrough in accordance with said mask whereby regions of said metal are uncovered;

(f) etching through the perforations of said thin layer to remove the uncovered metal and to thus uncover regions of said electrically insulating photoresist;

(g) exposing the uncovered regions of said electrically insulating photoresist;

(h) developing said electrically insulating photoresist to uncover said regions including and closely surrounding said photodetectors and said regions on said read-out conductors, and (i) removing the thin layer from atop the metal.

2. The method as recite in claim 1 wherein step (i) preceeds step (g).

* * * * *